United States Patent [19]
Sugasawara

[11] Patent Number: 6,124,143
[45] Date of Patent: Sep. 26, 2000

[54] PROCESS MONITOR CIRCUITRY FOR INTEGRATED CIRCUITS

[75] Inventor: Emery O. Sugasawara, Pleasanton, Calif.

[73] Assignee: LSI Logic Corporation, Milpitas, Calif.

[21] Appl. No.: 09/013,510

[22] Filed: Jan. 26, 1998

[51] Int. Cl.$^7$ ...................................................... H01L 21/66
[52] U.S. Cl. ................................ 438/18; 438/11; 702/65; 327/35; 327/378; 324/713
[58] Field of Search .................................. 438/18, 17, 10, 438/11; 702/65; 327/378, 35; 324/713

[56] References Cited

U.S. PATENT DOCUMENTS

| | | | |
|---|---|---|---|
| 5,068,547 | 11/1991 | Gascoyne | 307/443 |
| 5,486,786 | 1/1996 | Lee | 327/378 |
| 5,631,596 | 5/1997 | Sporck et al. . | |
| 5,654,895 | 8/1997 | Bach et al. . | |
| 5,686,855 | 11/1997 | Lee . | |
| 5,798,649 | 8/1998 | Smayling et al. | 438/18 |
| 5,867,033 | 2/1999 | Sporck et al. . | |
| 5,903,012 | 5/1999 | Boerstler | 438/18 |

OTHER PUBLICATIONS

LSI Logic Datasheet—Process Monitor (PROCMON) Cell, Feb. 1997 (10 pages).

*Primary Examiner*—Kevin M. Picardat
*Attorney, Agent, or Firm*—Akin, Gump, Strauss, Hauer & Feld, LLP

[57] ABSTRACT

Process monitoring circuitry according to the invention incorporates additional routing structures that approximate signal delays due to long metal routing paths. The additional process monitor circuitry builds upon existing approaches without increasing the die size of an integrated circuit through the utilization of excess silicon space available between the bonding pads and the scribe lines of an integrated circuit wafer. More specifically, supplemental metal routing lines and vias are included in the delay paths of process monitor circuitry and located on the integrated circuit such that impact to other metal signal lines/vias used in the actual design is minimized. The supplemental metal routing lines are disposed in unused routable silicon space, such that no silicon area penalty is suffered as a result of having long metal routing lines. During the testing of an integrated circuit incorporating the improved process monitor circuitry, test signals for determining the relative strength of different types of transistors of the integrated circuit are extracted. These test signals are compared to simulated delay values that reflect the delays of the additional metal routing lines and vias. Extreme process variations cause the values provided by the process monitor's circuitry to fall outside the set of permissible values determined through three-dimensional simulation. Thus, process monitoring circuitry according to the present invention improves the fault coverage provided by the testing procedures for an integrated circuit by providing information regarding process variations in different metal layers, and may be utilized as a surrogate for observable path testing.

15 Claims, 5 Drawing Sheets

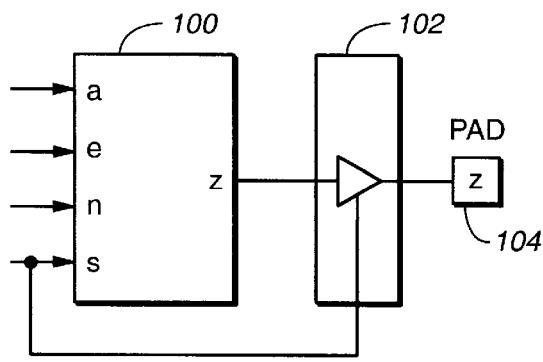
FIG._1A
(PRIOR ART)
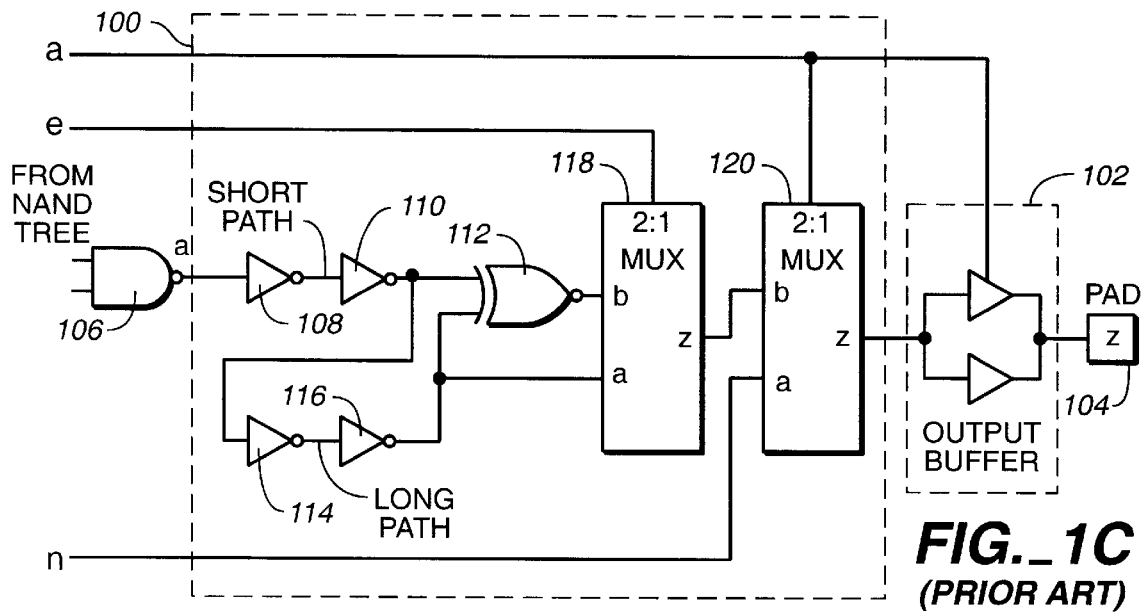
FIG._1B
(PRIOR ART)
FIG._1C
(PRIOR ART)
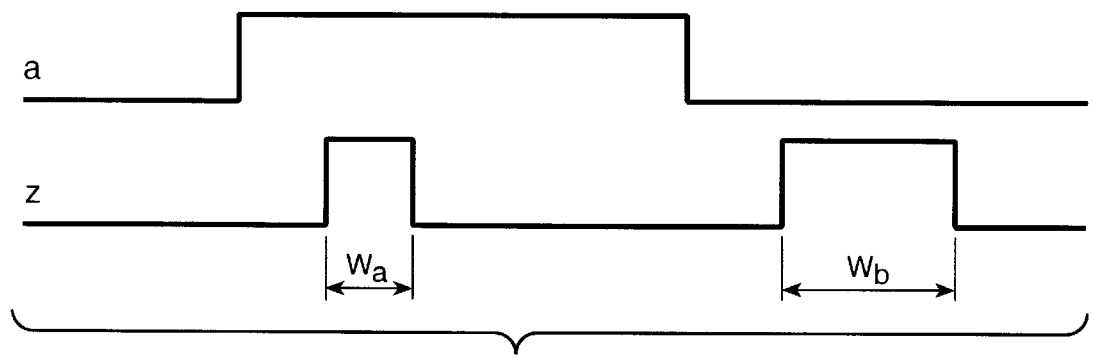
FIG._2

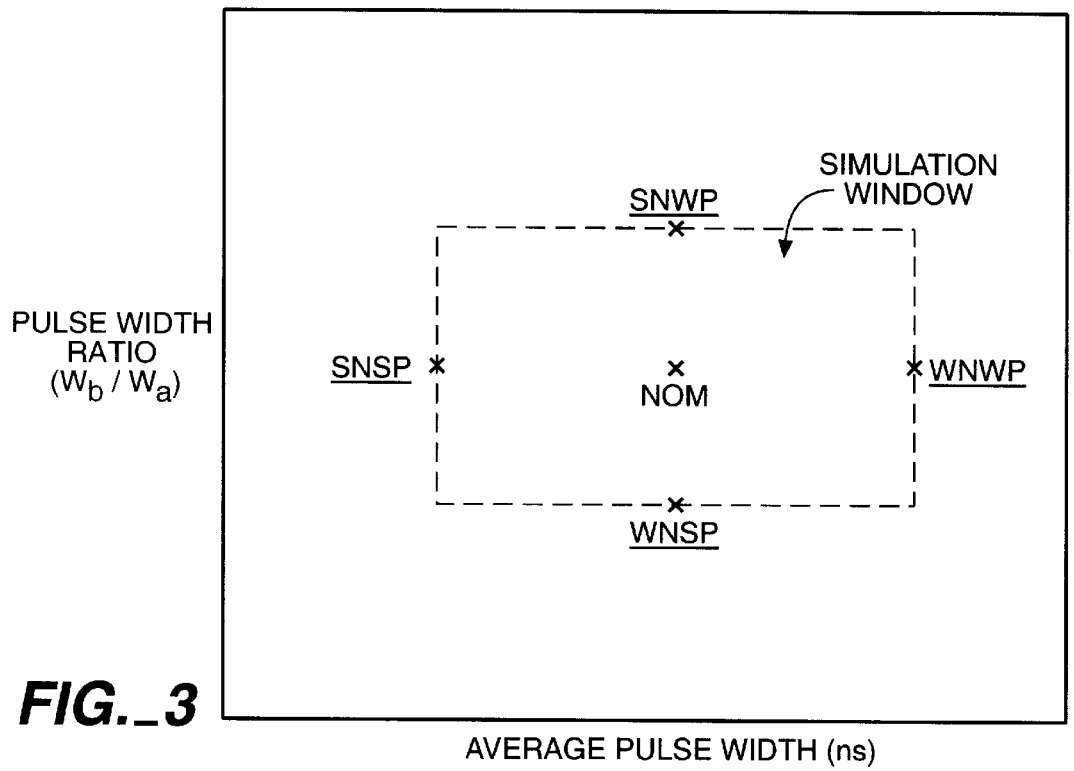
FIG._3
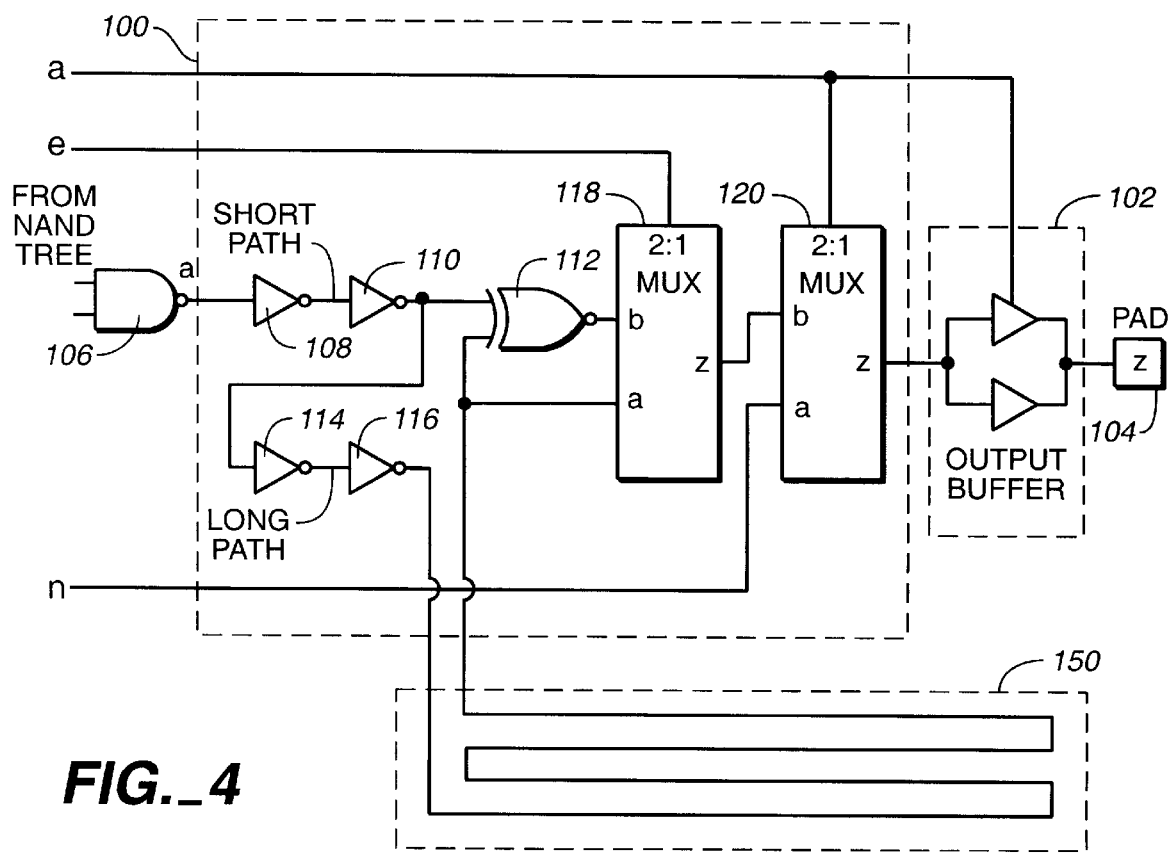
FIG._4

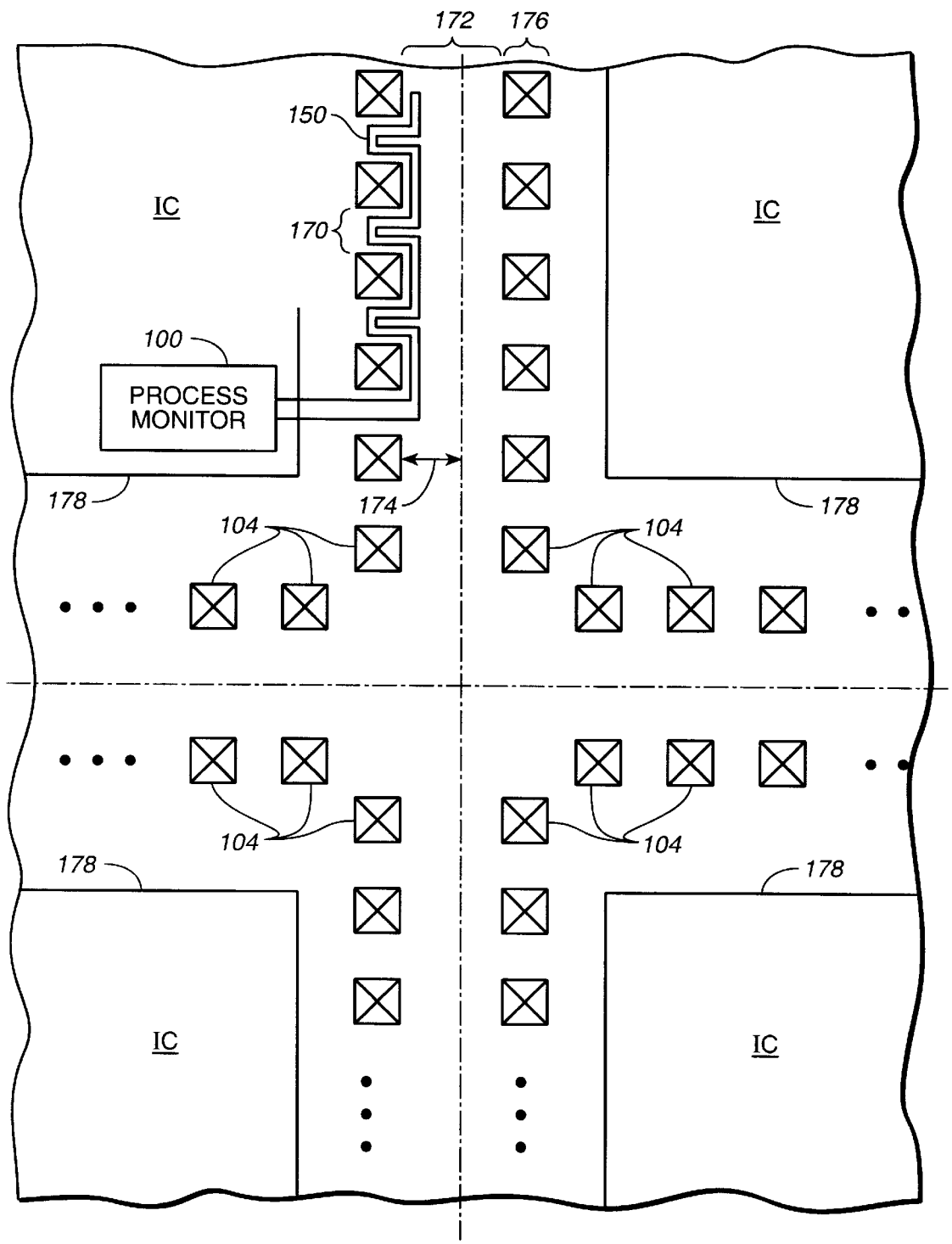
FIG._5

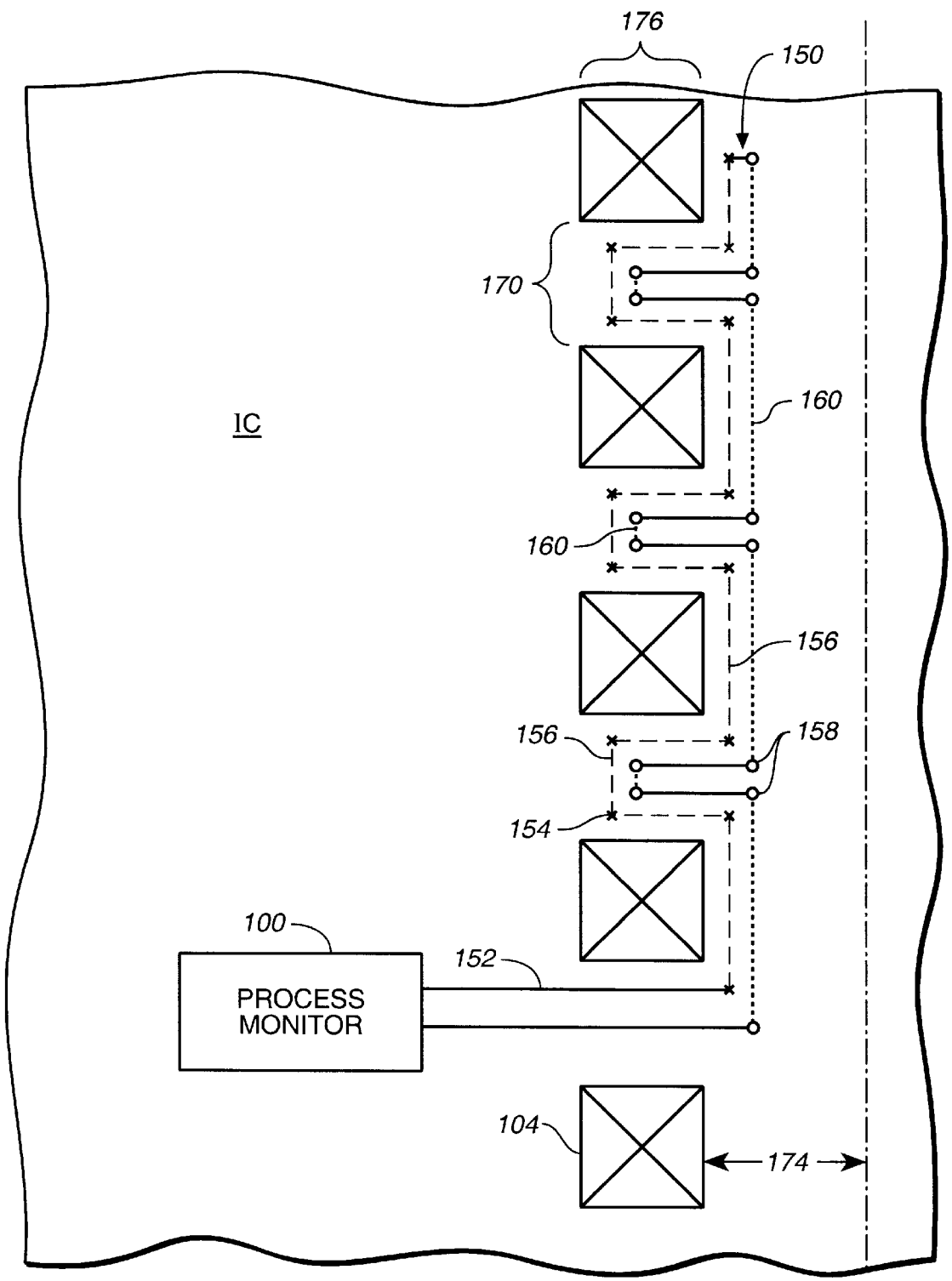
FIG._6A

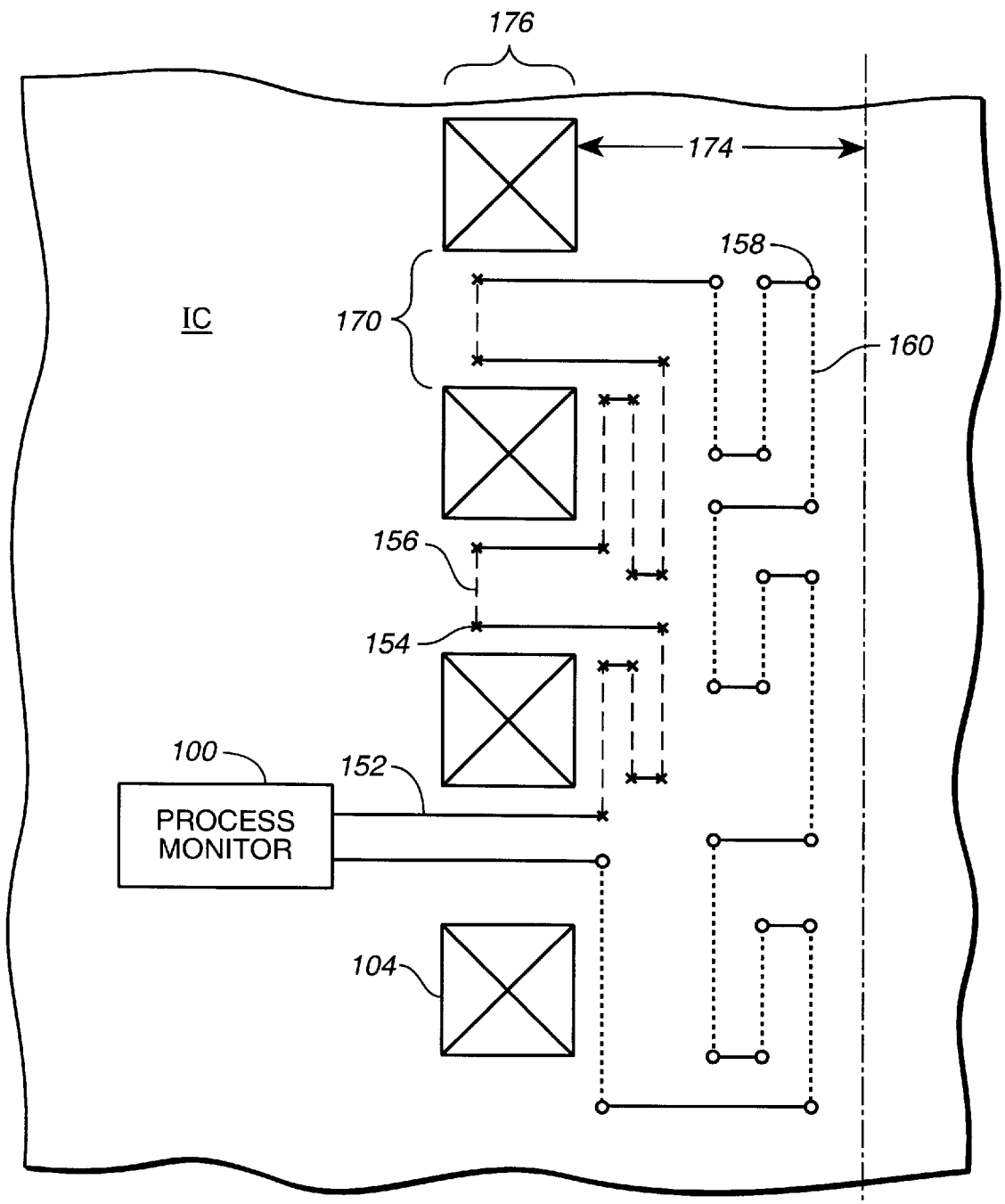
FIG._6B

PROCESS MONITOR CIRCUITRY FOR INTEGRATED CIRCUITS

BACKGROUND OF THE INVENTION

1. Field of the Invention

The present invention relates to testing of semiconductor devices, and more particularly to process monitor structures for accurately predicting the performance of an integrated circuit with respect to simulations.

2. Description of the Related Art

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits (also referred to as "chips") may use many functions that previously could not be implemented together on a single chip, including: microprocessors, digital signal processors, mixed signal and analog functions, large blocks of memory and high speed interfaces. It is a common practice for the manufacturers of such integrated circuits to thoroughly test device functionality at the manufacturing site. However, the complex nature of today's integrated circuits presents new testing challenges.

Interconnecting the millions of logic gates and megabytes of memory that may be present on a chip also poses difficulties. To aid in this task, new multiple layer metallization schemes have been developed that allow up to five or more distinct "levels" or layers of metal interconnect wires, with pitches of 0.125 µm and tighter on the first few layers. In such multiple layer metallization schemes, the various metal interconnect wires typically have different nominal widths and heights, different distances from transistor gates, and are insulated by oxide layers of varying thickness. These differences in the physical properties of the metal layers cause different metal layers to exhibit somewhat dissimilar electrical characteristics, resulting in disparities in propagation delays that a signal experiences when communicated over routing wires formed from the different metal layers.

Often, the performance of the integrated circuitry can be dominated by propagation delays through longer metal interconnect wires rather than the basic gate delays of individual logic elements. This phenomenon is exacerbated by the fact that as the width of a wire shrinks in deep submicron designs, the resistance of the wire increases more rapidly than capacitance decreases. It has been estimated that interconnect delays may thus determine as much as 70–80% of the total delay in integrated circuits implemented in 0.25 µm process rules. An increase in average propagation delays frequently results in a greater number of critical timing paths (e.g., signal paths in which best or worst case simulated propagation delays may approach the limits required for proper functionality). Many timing problems involve such critical timing paths.

In order to avoid timing and other problems, integrated circuits are typically simulated in a software environment, using a variety of CAE tools, before the integrated circuits are actually fabricated. Such simulations function to reduce costly design iterations because modifications to an integrated circuit design are more readily achieved in software. Given the complexity of today's integrated circuits, accurate simulation is thus essential to a successful integrated circuit design.

Following fabrication of an integrated circuit, testing is performed to insure that the integrated circuit functions as designed. Although the integrated circuit may work functionally, it may not operate at the proper frequency at which it was designed to operate. Certain testing methodologies are employed to verify that the integrated circuit works "at speed." One such method is to test all circuitry functionally at the highest frequency at which the integrated circuit is designed to operate. At speed testing is typically not performed, however, because it is extremely difficult to create test patterns to check integrated circuits at high frequencies. Further, specialized testers are also required. Under test conditions, the shortest directly measurable path in a high performance integrated circuit design is typically less than 10 ns. Measurement inaccuracies in automatic testing equipment and analog effects in the testing environment can represent a large portion of such time (the observable path), thus rendering the test meaningless.

As a result, another method used to verify at speed functionality involves measuring predetermined critical paths and assume that if these critical paths meet the timing specifications, all other paths are within specification. However, identification and measurement of critical paths is sometimes difficult.

To address these difficulties, process monitoring circuitry has been developed that resides on the integrated circuit itself. One such process monitor is the "PROCMON" cell developed by LSI Logic Corporation of Milpitas, Calif. The PROCMON circuits are tested and their performance serves as a parametric test of the integrity of the manufacturing process.

In complementary metal-oxide-semiconductor (CMOS) circuits, the performance of the integrated circuit depends on the performance of both p-channel (PMOS) and n-channel (NMOS) transistors. Since the PMOS and NMOS transistors are formed at different stages of the manufacturing process, process variations at a given step may not affect the PMOS and NMOS transistors equally. As explained more fully below in the detailed description of the present invention, the PROCMON cell includes a short and long delay paths providing a first edge delay pulse in response to a logic level high to a logic low transition signal at the input terminal, and providing a second edge delay pulse when a logic low to logic high transition signal is provided at the same input terminal. The differences between the edge delay pulses are indicative of the relative performance of the PMOS and NMOS transistors being monitored.

However, given the increased length of routing that is frequently encountered in today's integrated circuits, the PROCMON cell may not take into account delays associated with long metal lines and/or a multitude of vias in certain delay paths. The PROCMON cell does monitor "short" and "long" signal paths, however the "long" signal path is typically contained within the cell itself and may not reflect actual routing. Because the long metal paths are contained within the PROCMON cell, length of routing and the number of vias that can be utilized are also limited. Further, process monitor circuits such as the PROCMON cell are typically routed in the first layer of interconnect metal, such that resistance changes between the vias connecting this layer of metal and second layer and third layer (or more) metals, or resistance changes in the other metal layers themselves do not get monitored. Thus, the load on the output of one transistor may be accounted for in simulation, but the length of the metal line or number of vias needed would not be accurately simulated. Therefore, if a process problem develops that effects the resistance or capacitances of different metal layers or vias, the current process monitors may not detect such problems. More specifically, no attempt is currently made to measure either the resistances or capacitances of long metal lines (with many vias) on different metal layers.

SUMMARY OF THE INVENTION

Briefly, process monitoring circuitry according to the present invention incorporates additional routing structures that approximate signal delays due to long metal routing paths incorporating a multitude of vias. Process variations that affect the resistance and capacitances of different metal layers or vias can thus be detected. The additional process monitor circuitry builds upon existing approaches without increasing the die size of an integrated circuit. This is accomplished by using excess silicon space available between the bonding pads and the scribe line of an integrated circuit wafer.

More specifically, improvements to the process monitoring circuitry are accomplished through the addition of supplemental metal routing lines with multiple vias to increase the amount of interconnect delays in the existing process monitor delay paths. These additions more closely approximate the actual design layout, and therefore more accurately predict the performance of a completed integrated circuit with respect to the simulation. The supplemental metal routing lines preferably include all available layers of metal that are typically used in signal routing for the integrated circuit, and are placed on the integrated circuit such that impact to other metal signal lines/vias used in the actual design is minimized. Preferably, the supplemental metal routing lines are disposed in the region of an integrated circuit between the bonding pads and the scribe line. This space is typically unused silicon space, such that no silicon area penalty is suffered as a result of having long metal routing lines.

During the testing of an integrated circuit incorporating the improved process monitor, test signals for determining the relative strength of different types of transistors of the integrated circuit are extracted. These test signals are compared to simulated delay values that reflect the delays of the additional metal routing lines and vias. The simulation values are determined by performing a three-dimensional device-level simulation of all of the components of the delay paths of the process monitor. After the simulation limits are determined, these values are used to set tester limits. Extreme process variations cause the values provided by the process monitor's circuitry to fall outside the set of permissible values. Thus, process monitoring circuitry according to the present invention improves the fault coverage provided by the testing procedures for an integrated circuit by providing information regarding process variations in different metal layers, and may be utilized as a surrogate for observable path testing.

BRIEF DESCRIPTION OF THE DRAWINGS

A better understanding of the present invention can be obtained when the following detailed description of the preferred embodiment is considered in conjunction with the following drawings, in which:

FIG. 1A is a block diagram illustrating a prior art process monitor;

FIG. 1B is a truth table relating the input signals A, E, S and N with the output signal Z in the process monitor of FIG. 1A;

FIG. 1C is a schematic diagram providing exemplary details of the process monitor of FIG. 1A;

FIG. 2 is a timing diagram illustrating operation of a process monitor according to the present invention;

FIG. 3 is a graph illustrating a simulation of process factors for a CMOS integrated circuit as sensed and calculated using a process monitor according to the present invention;

FIG. 4 is a schematic diagram of a process monitor incorporating supplemental metal routing lines in accordance with the present invention;

FIG. 5 is a schematic plan view of portions of a semiconductor wafer manufactured in accordance with the present invention; and FIGS. 6A and 6B are plan views illustrating alternate embodiments the supplemental metal routing lines of process monitor circuitry according to the present invention.

DETAILED DESCRIPTION OF THE PREFERRED EMBODIMENT

Referring now to the drawings, FIG. 1A is a block diagram illustrating a prior art process monitor 100. Many different configuration are possible for the process monitor 100, and the precise implementation is not considered critical to the invention.

In order for an integrated circuit fabricated in a complementary metal-oxidese-miconductor (CMOS) process to operate properly, the relative electrical characteristics of the NMOS and PMOS transistors which form logic gates generally need to be within specified ranges. The relative qualities of the NMOS and PMOS devices, measured in terms of a figure of merit, is known in the art as the "process factor." Typically, the figure of merit is the switching speed of the device.

There are numerous parameters that can be varied during fabrication to cause NMOS devices to have higher merit, or be stronger, than PMOS devices and vice-versa. For this reason, the process monitor 100 is integrally fabricated with each integrated circuit, and includes NMOS and PMOS transistors that are identical to those in the functional or logical devices of the circuit. The process monitor 100 is preferably accessible via the standard input/output (I/O) pins of the integrated circuit, and enables measurement of the process factor prior to and following packaging of the integrated circuit. In the disclosed embodiment, the process monitor 100 includes a number of input signals A, E, N and S and an output signal Z. The output signal Z is provided to an output pad 104 of an integrated circuit via a buffer 102.

FIG. 1B is a truth table relating the input signals A, E, S and N with the output signal Z in the process monitor 100. FIG. 1C is a schematic diagram providing exemplary details of the process monitor 100 of FIG. 1A. As described below, the process monitor 100 circuitry utilizes the fact that electrons move faster than holes—thus P-channel transistors are almost always slower than N-channel transistors of equal size. The process monitor 100 generates edge delay pulses resulting from signal propagation in the short and long delay paths. The differences in the delay times indicate the relative strength of the two types of transistors, and are compared to device-level simulation results (FIG. 3). Because edge delay pulse widths are measured, accuracy is independent of input edge placement.

More specifically, due to the slower carrier mobility of PMOS transistors as compared to NMOS transistors, certain types of CMOS logic gates, such as some inverters and NOR gates, produce output pulses in response to input pulses in which the rising (positive-going) edges are sharper (delayed less) than the falling (negative-going) edges. This is due to the fact that the pull-up transistors in these gates are PMOS, whereas the pull-down transistors are NMOS. The PMOS pull-up transistors pull up to the logic high level slower than the NMOS pull-down transistors pull down to the logic low level, thereby creating rising edge delays that are longer than falling edge delays. These differences are manifested in the edge delay pulses of the output signal Z of the process monitor 100.

Referring more specifically to FIG. 1C, the test input signal A is provided by a NAND gate 106, which is preferably part of a "NAND Tree" test structure. As known to those skilled in the art, a NAND Tree is an I/O characterization test approach that facilitates DC tests and generation of DC test vectors. The test input signal A is provided to short and long delay paths of the process monitor 100. The short delay path is represented by series connected inverters 108 and 110, although other numbers and types of logic gates (such as NOR gates) could be utilized. In addition to the logic gates of the short delay path, the long delay path is represented by a buffer 114 connected in series with an inverter 116. Again, other numbers and types of logic gates could be utilized in the long delay path.

The exclusive-NOR gate 112 produces a logic high output when the input signals provided by the outputs of the inverters 110 and 116 are the same, and a logic low output when the input signals provided by the outputs of the inverters 110 and 112 are different (substantially equivalent results can be produced by replacing the gate 112 with an exclusive-OR gate). The exclusive-NOR gate 112 will thus produce edge delay pulses in response to logic level transitions on the input signal A. The outputs of the inverters 110 and 116 will be the same during a period of time approximating the signal propagation delay experienced through logic gates 114 and 116 of the long delay path. As mentioned, differences between edge delay pulses are indicative of the relative performance of the PMOS and NMOS transistors being monitored.

The output of the exclusive-NOR gate 112 is provided to one input of a 2:1 multiplexer 118 for provision to the test pad 104. The 2:1 multiplexers 118 and 120 of the disclosed embodiment of the invention also allow other test signals to be provided on the test pad 104. For example, when the input signal S is at a logic low level the input signal N is provided on the test pad 104. When the enable signal E is at a logic low level and the input signal S is at a logic high level, an inverted version of the test input signal A is provided on the test pad 104. When both the enable signal E and the input signal S are at a logic high level, the test pad 104 provides edge delay pulses in accordance with the present invention.

The output buffer 102 which drives the test pad 104 (output signal Z) is preferably switchable. When the input signal S is at a logic high level, the drive capability of the output buffer 102 is reduced by half to reduce noise in the test environment. When the input signal S is at a logic low level, the output buffer 102 functions normally.

Numerous other process monitor configurations are capable of being utilized with the present invention. For example, commonly-owned U.S. Pat. No. 5,068,547, entitled "PROCESS MONITOR CIRCUIT", issued Nov. 26, 1991 to William H. Gascoyne and hereby incorporated by reference for all purposes as if set forth in its entirety, discloses a monitor circuit for measuring the process factor for a production run of CMOS integrated circuits as discussed above. The monitor circuit of Gascoyne makes use of numerous NOR gates and inverters in its delay paths.

Another process monitor capable of being utilized with the present invention is disclosed in commonly-owned U.S. Pat. No. 5,486,786, entitled "PROCESS MONITOR FOR CMOS INTEGRATED CIRCUITS", issued Jan. 23, 1996 to Teh-Kuin Lee and hereby incorporated by reference for all purposes as if set forth in its entirety. The process monitor of Lee includes delay units that are connected to form a ring oscillator that generates pulse having different phases at the outputs of the delay units. Again, however, the precise configuration of the logic configuration of the process monitor cell 100 is not considered critical to the invention.

FIG. 2 is a timing diagram illustrating operation of a process monitor 100 according to the present invention. The process monitor 100 uses delay paths to produce edge delay pulses (shown as Wa and Wb) on the output signal Z that can be measured very precisely on any test equipment. The process monitor 100 edge delay pulses Wa and Wb are much longer than the pulses provided by most observable paths. The combination of delay and transistor measurements represented by the pulses are analyzed and compared with simulated values (e.g., FIG. 3) to determine if the integrated circuit is likely to function as designed.

The rising edge delay pulse Wa corresponds to a rising edge of the input signal A. The rising edge delay pulse Wa is primarily determined by the strength of the NMOS transistors of the process monitor 100. The rising edge delay pulse Wa will increase as the strength of the NMOS transistors increases, and vice-versa. Similarly, the rising edge delay pulse Wb corresponds to a falling edge of the input signal B and is primarily determined by the strength of the PMOS transistors of the process monitor 100. The rising edge delay pulse Wb varies in an inverse relationship to the strength of the PMOS transistors.

Referring now to FIG. 3, a graph illustrating a simulation of process factors for a CMOS integrated circuit as sensed and calculated using a process monitor 100 according to the present invention is shown. The results of device-level simulations such as those illustrated in FIG. 3 are used to establish the tester limits (illustrated by the simulation window) for determining if the outputs of the process monitor 100 reflect an acceptable process run. In accordance with the present invention, supplemental metal routing lines 150 (FIG. 5) are also factored into the simulations. The supplemental metal routing lines 150 allow the simulations to more closely approximate the relatively lengthy metal routing lines of today's integrated circuits IC.

The graph of FIG. 3 is typically derived by plotting the ratio of the edge delay pulses Wb/Wa on the vertical axis, and the average edge delay pulse [(rising edge delay pulse+ falling edge delay pulse)/2] on the horizontal axis. The process factor is generally computed as being equal to the ratio of the edge delay pulses Wb/Wa, although it can be subjected to normalization or other computation as described in the patent to Gascoyne.

To determine test limits, process parameters are varied in the simulations to vary the relative strengths of the NMOS and PMOS transistors. As depicted, simulations having each of the following characteristics are performed: strong NMOS and weak PMOS transistors (SNWP), weak NMOS and strong PMOS (WNSP) transistors, strong NMOS and strong PMOS (SNSP) transistors, and weak NMOS and weak PMOS (WNWP) transistors. Nominal (NOM) transistor strengths, as well as potential variations in the electrical characteristics of the different layers of interconnect metal and vias may also be included in the simulations.

The four corners of the graph at SNWP, WNSP, SNSP and WNWP thus constitute the conceptual limits of acceptable process variation for the four extreme combinations of NMOS and PMOS transistors (as well as metallization variations). In order for an integrated circuit to pass parametric testing, the measured outputs of the process monitor cell 100 must lie within "simulation window".

The simulation values SNWP, WNSP, SNSP and WNWP are determined by performing a three-dimensional device-level simulation of all of the components of the delay paths of the process monitor 100. After the simulation limits are determined, these values are used to set tester limits. Extreme process variations cause the values provided by the process monitor 100's circuitry to fall outside the set of permissible values and fail testing.

FIG. 4 is a schematic diagram of a process monitor 100 incorporating supplemental metal routing lines 150 in accordance with the present invention. The supplemental metal routing lines 150 are comprised of metal routing lines and vias, and are preferably included as part of the long delay path, although other configurations are possible. Inclusion of the supplemental metal routing lines 150 in the process monitoring circuitry allows the process monitor 100 to provide information regarding process variations in different metal layers.

Referring now to FIG. 5, a schematic plan view of portions of a semiconductor wafer manufactured in accordance with the present invention is shown. Many semiconductor die or integrated circuits IC are typically formed on a single silicon wafer. Each integrated circuit IC contains the complete device being manufactured, including a core logic region 178 and bond pad rows 176, and is bounded by adjacent "scribe lines" 172 in the horizontal and vertical directions. A scribe line 172 (also referred to as a "kerf", "saw-kerf" or "street") is a space on the wafer, between bond pad rows 176 of each integrated circuit IC, that is large enough to allow separation of the integrated circuits IC by cutting or breaking, without damage to the integrated circuits IC. It will be appreciated by those skilled in the art that a majority of the scribe line 172 may be removed during the packaging process. A routable region (i.e., silicon area that is capable of supporting metal routing lines) 174 of each integrated circuit IC between the bond pad rows 176 and the scribe line(s) 172 is utilized for supplemental metal routing lines 150.

The process monitor 100 is preferably located in the core logic region 100 of each integrated circuit IC. In accordance with the invention, supplemental metal routing lines 150 are disposed in the excess silicon space 170 available between bonding pads 104 and in the routable region 174 of each integrated circuit IC. The supplemental metal routing lines 150 also preferably include multiple via structures to increase the amount of interconnect delays in the process monitor 100 delay paths. The supplemental metal routing lines 150 more closely approximate the actual design layout, and therefore more accurately predict the performance of the signal paths of a completed integrated circuit IC.

The term bond pad (or "bonding pad") 104 refers herein to a relatively large metallic area positioned on a planar surface of the integrated circuit IC. Bond pads 104 function to provide electrical contact between the integrated circuit IC and a leadframe (not shown), typically via bond wires or "solder bump/micro-bump" connections. Bond pads 104 are commonly incorporated in layout structures known as "pad cells" (not separately illustrated). The pad cells are typically disposed in rows about the periphery of the integrated circuit IC in a ring-shaped area between the core logic regions 178 and the scribe line 172. In addition to the bond pad 104, pad cells customarily include electrostatic discharge (ESD) protection circuitry and I/O circuitry such as pad drivers, slew rate control circuitry, and current spike suppression logic.

One reason for placing bond pads 104 around the periphery of an integrated circuit IC is that such placement permits a large number of I/O connections to the integrated circuit IC without unnecessarily long or crossing bond wires. Bond pad 104 pitch and associated packaging concerns are sometimes addressed by using special bonding techniques, such as "wedge-wedge" bonding (utilizing wedge-shaped bonding pads) and "double-tier" bonding. Also, a number of packaging technologies exist that permit reduced bond pad pitches, such as "flip-chip" (wherein connections are made to bump contacts covered with a conductive bonding agent on the face of a hybrid circuit) and tape automated bonding (TAB).

In order to reduce bond pad pitch, semiconductor manufacturers have also created "staggered" bond pads 104. In a staggered bonding approach, two staggered and substantially parallel rows of bond pads 104 are provided rather than the more conventional single row, in-line arrangement that is illustrated. It is contemplated that process monitoring circuitry according to the invention can be utilized with any of the aforementioned bonding schemes. The process monitor 100 of the disclosed embodiment of the invention preferably utilizes one bond pad 104 to provide output pulses to testing equipment.

FIGS. 6A and 6B are plan views illustrating alternate embodiments of the supplemental metal routing lines 150 according to the present invention. The supplemental metal routing lines 150 preferably include all available layers of metal that are typically used in signal routing for an integrated circuit IC. The supplemental metal routing lines 150 are placed on the integrated circuit IC such that impact to other metal signal lines/vias used in the actual design is minimized.

The disclosed integrated circuit IC is implemented in a complimentary metal-oxide-semiconductor (CMOS) process having three metal interconnect layers for forming interconnect wires referred to by reference numerals 152, 156, and 160. In the disclosed embodiment of the invention, reference numeral 152 refers to interconnect lines formed on a first layer of metal, while reference numerals 156 and 160 refer to interconnect lines formed on second and third layers, respectively. As will be apparent to those skilled in the art, however, the present invention could be utilized with other numbers of interconnect layers or any type of fabrication process, including bipolar-based or gallium arsenide (GaAs) processes. Further, the various interconnect metal layers may be formed of a variety of materials, including aluminum, copper or any suitable conductive alloy.

The metal routing lines 152, 156 and 160 are isolated by a series of oxide layers (not shown). The oxide layers are typically formed of a dielectric or non-conducting film that is grown or deposited on the surface of the integrated circuit IC. The metal routing lines 152, 156, and 160 are electrically coupled by "via" structures 154 and 158. As known to those skilled in the art, a via is an opening in an insulating oxide layer between metal layers that provides an electrical pathway from one metal layer to the metal layer above or below it. In the disclosed embodiment of the invention, metal routing lines 152 and 156 are coupled by vias 154, while metal routing lines 152 and 160 are coupled by vias 158. Although not explicitly shown, additional vias for coupling metal routing lines 156 and 160 could also utilized. Various other traditional components of the CMOS circuitry have been omitted for sake of clarity.

Referring more specifically to FIG. 6A, the metal routing lines 150 are shown primarily disposed in the excess silicon space 170 available between the bonding pads 104 of the bond pad row 176. In order to maximize usage of the available area, the metal routing lines 150 are routed in a serpentine-like manner.

In the embodiment of the invention shown in FIG. 6B, the metal routing lines 150 are primarily disposed in the routable region 174 of the integrated circuit IC between the bond pad row 176 and the outer boundary of the integrated circuit IC bordering the scribe line 172. This space is typically unused silicon space, such that no silicon area penalty is suffered. In addition, it is possible to measure the process monitor 100 outputs via probing prior to separation of the integrated circuits IC, or at a later point in time after the integrated circuits IC have been packaged.

The routing patterns of the supplemental routing lines 150 shown in FIGS. 6A and 6B are exemplary in nature, and it will be appreciated by those skilled in the art that many other routing patterns could be utilized to take advantage of the available.

In most semiconductor processes, the various metal routing lines 152, 156 and 160 have different nominal widths and heights, different distances from transistor gates, and are insulated by oxide layers of varying thickness. These differences result in variations in the resistance per unit length and capacitance values associated with the metal routing lines 152, 156 and 160. Other process-related parameters, such as via 154 and 158 resistances may also differ. All of the aforementioned parameters may effect the propagation delay that a signal experiences on a given metal layer. Incorporating the supplemental metal routing lines 150 in the process monitoring circuitry provides some indication of process variations which may impact the electrical characteristics of metal routing lines.

Thus, process monitoring circuitry according to the present invention allows use of statistical process control techniques to expedite debugging efforts. The process monitoring circuitry improves the fault coverage provided by the testing procedures for an integrated circuit by providing information regarding process variations in different metal layers, and may be utilized as a surrogate for observable path testing.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A process monitor structure for an integrated circuit having a core logic portion and a plurality of bond pads, the integrated circuit manufactured in a semiconductor process having at least first and second types of transistors for forming logic gates, the semiconductor process further utilizing multiple layers of interconnect material to form interconnect wires for signal paths between circuit components, the process monitor structure comprising:

process monitor circuitry including at least one signal delay path, the process monitor circuitry providing output pulses representative of the relative electrical characteristics of the first type of transistor and the second type of transistor, the output pulses further providing information for detecting process variations in the multiple layers of interconnect material; and supplemental metal routing line(s) formed of the multiple layers of interconnect material and electrically coupled to and forming a portion of the at least one signal delay path, a substantial portion of the supplemental metal routing line(s) being disposed external to the core logic region of the integrated circuit.

2. The process monitor structure of claim 1, wherein the integrated circuit further includes a routable region between the plurality of bond pads and an outer boundary of the integrated circuit abutting a scribe line, a substantial portion of the supplemental metal routing line(s) being positioned in the routable region of the integrated circuit.

3. The process monitor structure of claim 1, wherein a substantial portion of the supplemental metal routing line(s) is interposed between or in close proximity to the bond pads.

4. The process monitor structure of claim 3, wherein the bond pads are arranged in a staggered configuration.

5. The process monitor structure of claim 3, wherein the bond pads comprise solder bumps.

6. The process monitor structure of claim 1, wherein the multiple layers of interconnect material include at least three layers, the supplemental metal routing line(s) being formed on at least two of the layers.

7. The process monitor structure of claim 6, wherein the total length of the supplemental routing line(s) approximates the length of longer signal paths of the integrated circuit.

8. The process monitor structure of claim 6, wherein the supplemental routing line(s) comprise a plurality of supplemental via structures, the number of supplemental via structures approximating the number of via structures of longer signal paths of the integrated circuit.

9. The process monitor structure of claim 1, wherein the process monitor circuitry is disposed in the core logic region of the integrated circuit.

10. The process monitor structure of claim 1, wherein the at least one signal delay path comprises a short delay path and a long delay path, and wherein the supplemental metal routing line(s) form a portion of the long delay path.

11. The process monitor structure of claim 1, wherein the process monitor circuitry provides first and second edge delay pulses.

12. The process monitor structure of claim 1, wherein the semiconductor process is a complementary metal-oxide-semiconductor (CMOS) process.

13. An integrated circuit, comprising:

a semiconductor substrate;

a plurality of circuit elements formed on the substrate;

a plurality of bond pads coupled to the circuit elements; and a process monitor structure formed on the substrate, the process monitor comprising:

process monitor circuitry including at least one signal delay path, the process monitor circuitry providing output pulses representative of the relative electrical characteristics of the first type of transistor and the second type of transistor, the output pulses further providing information for detecting process variations in the multiple layers of interconnect material; and supplemental metal routing line(s) formed of the multiple layers of interconnect material and electrically coupled to and forming a portion of the at least one signal delay path, a substantial portion of the supplemental metal routing line(s) being disposed external to the core logic region of the integrated circuit.

14. The integrated circuit of claim 13, further comprising:

a routable region between the plurality of bond pads and an outer boundary of the integrated circuit, a substantial portion of the supplemental metal routing line(s) being positioned in the routable region.

15. The integrated circuit of claim 13, wherein a substantial portion of the supplemental metal routing line(s) is interposed between or in close proximity to the plurality of bond pads.

* * * * *